(12) United States Patent
Akram et al.

(10) Patent No.: US 6,426,875 B1
(45) Date of Patent: Jul. 30, 2002

(54) HEAT SINK CHIP PACKAGE

(75) Inventors: Salman Akram; Larry Kinsman, both of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/651,330

(22) Filed: Aug. 29, 2000

Related U.S. Application Data

(62) Division of application No. 09/364,351, filed on Jul. 30, 1999, now Pat. No. 6,122,171.

(51) Int. Cl.[7] .............................................. H05K 7/20
(52) U.S. Cl. ................ 361/704; 361/707; 361/709; 361/717; 361/719; 257/706; 257/707; 257/712; 257/680; 257/723; 165/80.2; 165/185
(58) Field of Search ....................... 361/702, 703, 361/704, 707, 718, 719, 720, 722, 760; 257/206, 701, 712, 713, 717, 204; 174/16.2; 165/80.2, 80.3, 104.33, 185

(56) References Cited

U.S. PATENT DOCUMENTS

| | | | |
|---|---|---|---|
| 5,523,622 A | 6/1996 | Harada et al. | 257/734 |
| 5,572,405 A | 11/1996 | Wilson et al. | 361/705 |
| 5,598,321 A | 1/1997 | Mostafazadeh et al. | 361/704 |
| 5,705,851 A | 1/1998 | Mostafazadeh et al. | 257/675 |
| 5,719,440 A | 2/1998 | Moden | 257/697 |
| 5,724,232 A | 3/1998 | Bhatt et al. | 361/762 |
| 5,729,432 A | 3/1998 | Shim et al. | 361/690 |
| 5,793,118 A | 8/1998 | Nakajima | 257/790 |
| 5,818,698 A | 10/1998 | Corisis | 361/790 |
| 5,854,507 A | 12/1998 | Miremadi et al. | 257/686 |
| 5,866,953 A | 2/1999 | Akram et al. | 257/790 |
| 5,903,052 A | 5/1999 | Chen et al. | 257/706 |
| 5,909,057 A * | 6/1999 | McCormick et al. | 257/704 |
| 5,936,305 A | 8/1999 | Akram | 257/753 |
| 5,959,353 A * | 9/1999 | Tomita | 257/729 |
| 5,959,356 A | 9/1999 | Oh | 257/738 |
| 6,081,037 A * | 6/2000 | Lee et al. | 257/778 |
| 6,104,093 A * | 8/2000 | Caletka et al. | 257/778 |
| 6,111,313 A * | 8/2000 | Kutlu | 257/697 |
| 6,201,301 B1 * | 3/2001 | Hoang | 257/712 |
| 6,248,951 B1 * | 6/2001 | Murali et al. | 174/52.2 |
| 6,255,143 B1 * | 7/2001 | Briar | 438/127 |

* cited by examiner

Primary Examiner—Boris L. Chervinsky
(74) Attorney, Agent, or Firm—Workman, Nydegger & Seeley

(57) ABSTRACT

The present invention relates to enhanced thermal management of a microelectronic device package on a printed circuit board (PCB) having a solder ring or dam that encompasses a ball array. The ring or dam bears stress from disparate coefficients of mechanical expansion between the PCB and the ball array.

13 Claims, 11 Drawing Sheets

HEAT SINK CHIP PACKAGE

RELATED APPLICATIONS

This application is a divisional of U.S. patent application Ser. No. 09/364,351, filed Jul. 30, 1999, now U.S. Pat. No. 6,122,171, which is incorporated herein by reference.

BACKGROUND OF THE INVENTION

1. The Field of the Invention

The present invention relates to a microelectronic assembly. More particularly, the present invention relates to heat management for packaged microelectronic assemblies. In particular, the present invention relates to a solder structure that acts as a heat sink for generated heat management and for resistance to destructive mechanical stresses experienced in packaged microelectronic devices.

2. The Relevant Technology

In the microelectronics industry, a substrate refers to one or more semiconductor layers or structures which includes active or operable portions of semiconductor devices. In the context of this document, the term "semiconductive substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term substrate refers to any supporting structure including but not limited to the semiconductive substrates described above.

In the packaging of microelectronic devices, heat management and mechanical stress management are important aspects of producing a reliable microelectronic article. The heat sink of a chip package allows for enhanced performance of the microelectronics. As the heat sink is bonded to supporting structures, disparate amounts of mechanical expansion between the supporting structures, the chip itself, and the printed circuit board (PCB) cause mechanical stresses that may cause the chip packaging process to have a low yield or that may cause the chip package to come apart during field use. As chips are being frequently packaged in connection with a PCB that has a ball array, mechanical stresses experienced in the chip package are transferred through individual solder balls in the ball array.

Miniaturization is the process of crowding an increasing number of microelectronic circuits onto a single chip. Additionally, miniaturization involves the reduction of the overall chip package size so as to achieve smaller and more compact devices such as hand-held computers, personal data assistants (PDA), portable telecommunication devices, and the like. Ideally, the chip package size would be no larger than the chip itself As the overall package is subject to miniaturization, ball arrays have been reduced to less than 1 mm pitch. Miniaturization has the counter-productive effect upon chip packaging of an increased heat load but a smaller chip package structure available to extract heat from the chip package.

FIG. 1 is a prior art depiction of a microelectronic chip package 10 that includes an integrated circuit chip 12. Bonded to integrated circuit chip 12 is a heat sink 15 that may be made of a material such as copper or some other metal having a preferred coefficient of thermal conductivity. A chip carrier 16 is bonded 30 to heat sink 15. A ball array 18 makes connection between chip carrier 16 and a printed circuit board 20.

Chip package 10 has a geometric center 22 that is considered to be the center of mechanical expansion and contraction. By "geometric center" it is understood that an integrated circuit chip may heat substantially uniformly or nonuniformly, depending upon what portions of the chip are most active during any given use. Thus the "geometric center" is understood to be the center of mechanical expansion for a given chip; the chip being the primary source of generated heat. The geometric center of a chip package may thus be considered to be the chip itself or, when viewed more closely, it may be considered to be the bilaterally symmetrical center region of the chip when observed in either cross section or plan view.

Ball arrays 18 may comprise an outer ball row 24 and an inner ball row 26. As chip package 10 expands and contracts during ordinary usage, although expansion and contraction at geometric center 22 is substantially nonexistent, mechanical stress experienced in ball arrays 18 becomes greater farther away from geometric center 22. In other words, outer ball row 24 experiences greater mechanical stress than inner ball row 26. Because outer ball row 24 is more susceptible to shear induced by mechanical effects than inner ball row 26, eventually, electrical contact is compromised and a yield failure during bum in occurs, or a field failure occurs.

As it is desirable to miniaturize a chip package, it is also notable within chip package 10 that heat sink 15 provides structure that causes the overall size of chip package to have an enhanced profile when viewed in elevational cross-section. This enhanced profile is counter to miniaturization. Thus, conflicting objectives and constraints exist between overall package size and heat management that will prevent destructive mechanical stress.

What is needed in the art is mechanical shear minimization of chip packaging that overcomes the problems of the prior art.

SUMMARY OF THE INVENTION

The present invention relates to the use of a heat sink in the form of a dummy solder ring or dam structure to be part of a microelectronic chip package. The present invention is particularly useful for board on chip (BOC) packages on a mother board, memory modules, or the like. The present invention is also particularly useful for chip on board (COB) packages. Additionally, the present invention is useful for flip chip on board technology, and ball grid arrays (BGAs) and other chip scale packages.

In the present invention a solder ring or dam heat sink is disposed upon a printed circuit board (PCB), upon the same side as the ball array, and in a manner that encircles or externally borders the ball array. Because the chip package is in close quarters with several heat-generating devices, and because they are usually housed in an enclosure such as a computer case, the chip package environment is at elevated temperatures. The elevated temperatures often require assisted cooling such as with a blower. At the elevated temperatures, the entire chip package becomes heated such that expansion and its accompanying mechanical stress is experienced. As a result, the largest proportion of mechanical stress is transferred through the solder ring or dam heat sink at the periphery of the chip package instead of through the individual balls of the ball array.

In a BOC embodiment of the present invention the integrated circuit chip is disposed upon the PCB underside, the active surface thereof is mounted on the PCB underside, and the integrated circuit chip is wire bonded to the PCB upper side. The PCB has a slot through which wire bonding connects the PCB traces to the integrated circuit chip.

In another embodiment of the present invention, the BOC technology is configured with the ball arrays upon the PCB upper side along with the solder ring or dam heat sink encircling and/or bordering the ball array, and additionally a chip-opposite heat sink may be attached to the PCB underside. With the additional chip-opposite heat sink, thermal management of the chip package is enhanced.

In another alternative embodiment of the present invention, COB technology includes the integrated circuit chip in which, the ball array, and the solder ring or dam heat sink are located upon the PCB underside. Additionally, a chip-level heat sink may be placed on the PCB upper side for enhanced thermal management qualities.

In another alternative embodiment, a flip chip has its ball array encircled or bordered by a solder ring or dam heat sink respectively. The heat sink is either directly bonded to the active surface of the flip chip, or to a die attach.

In another embodiment, a stack of chip packages is provided. In another embodiment, at least two chips are contacted by a PCB. In another embodiment, a stack of PCB is provided, wherein each PCB has at least two chips disposed on one side thereof These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention relates to an integrated circuit chip package that overcomes the heat dissipation problems of the prior art. The integrated circuit chip package has a heat sink that comprises a solder ring or dam that aids thermal dissipation and reduces mechanical stresses that are otherwise transferred through a ball array such as a fine-pitch ball array.

The present invention may include a fine pitch ball array, typically disposed upon a printed circuit board (PCB). The PCB is attached to an integrated circuit chip. External to the perimeter of the ball array, the inventive heat sink is disposed as a ring or dam by way of non-limiting example, made of solder material. The inventive ring or dam heat sink is preferably disposed upon the PCB surface that contains the ball arrays. The inventive heat sink is configured to incur the greatest amount of mechanical stress, with respect to the balls of the ball arrays, that is experienced during field use as well as during testing such as during bum in.

Reference will now be made to figures wherein like structures will be provided with like reference designations. It is to be understood that the drawings are diagrammatic and schematic representations of embodiments of the present invention and are not limiting of the present invention nor are they necessarily drawn to scale.

Figure 1:
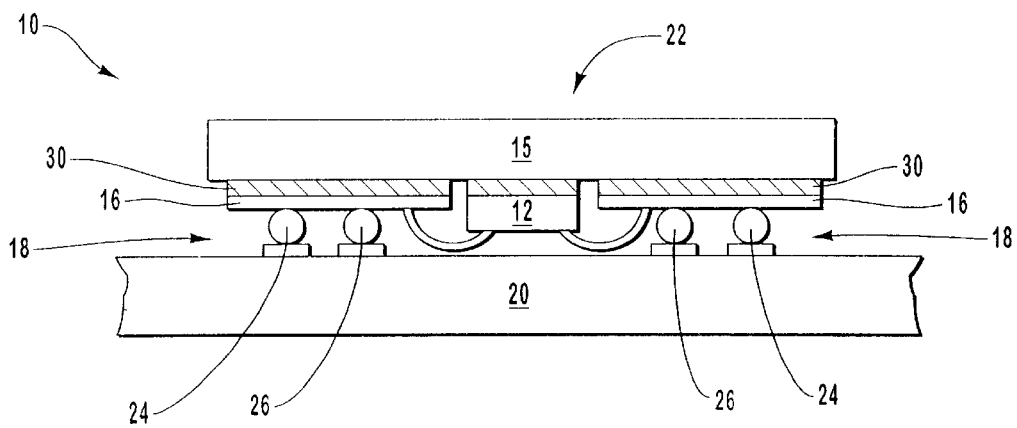
FIG. 1 is an elevational cross-section view of a prior art chip package.
Figure 2:
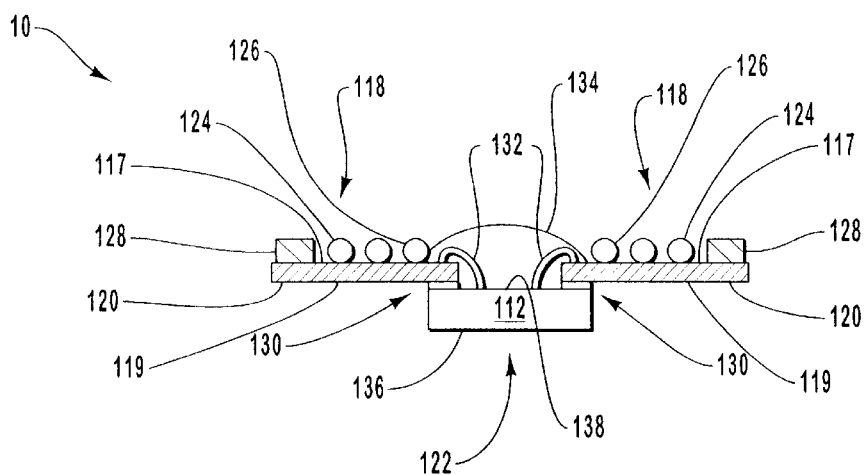
FIG. 2 is an elevational cross-section view of the inventive chip package.

FIG. 2 is an elevational cross-section view of a chip package 110 according to the present invention. Chip package 110 includes an integrated circuit chip 112 that is attached to a PCB 120 by use of an adhesive 130 such as a die-attach epoxy or equivalent. Chip package 110 has a geometric center 122. Bond wires 132 make an electronic connection between integrated circuit chip 112 and PCB 120 through a slot 136 in PCB 120. Within PCB 120, traces (not pictured) make electrical contact between integrated circuit chip 112 and ball arrays 118.

Ball arrays 118, when viewed in cross section, may include an outer ball 124, an inner ball 126, and optionally other balls located therebetween. Ball arrays 118 may also include a single row on each side of slot 136. Ball arrays 118 are located upon a PCB upper side 117. PCB upper side 117 is also referred to as the first side 117. The configuration of chip package 110, as seen in FIG. 2, is known as board on chip (BOC). As such, integrated circuit chip 112 is attached to the underside 119 of PCB 120. Underside 119 of PCB 120 is also referred to as the second side 119. An active surface 138 of integrated circuit chip 112 is affixed against underside 119.

An encapsulant 134 is disposed partially upon PCB 120 and partially upon active surface 138 of integrated circuit chip 112. Thereby, encapsulant 134 protects bond wires 132 during assembly and during field use. Geometric center 122 of chip package 110 is represented in FIG. 2 as being substantially the bilaterally symmetrical center of chip package 110 including integrated circuit chip 112 when viewed in elevational cross section.

Distal to outer ball 124 is a heat sink 128 that may be a solder dam or solder ring, also disposed upon PCB upper side 117. Solder ring heat sink 128 provides additional strength to chip package 110 if it is attached to a larger structure such as to a card or to a mother board. As integrated circuit chip 112 generates heat, solder ring heat sink 128 bears most of the mechanical expansion stress because during mechanical expansion, solder ring heat sink 128 is disposed farthest from geometric center 122.

Figure 3:
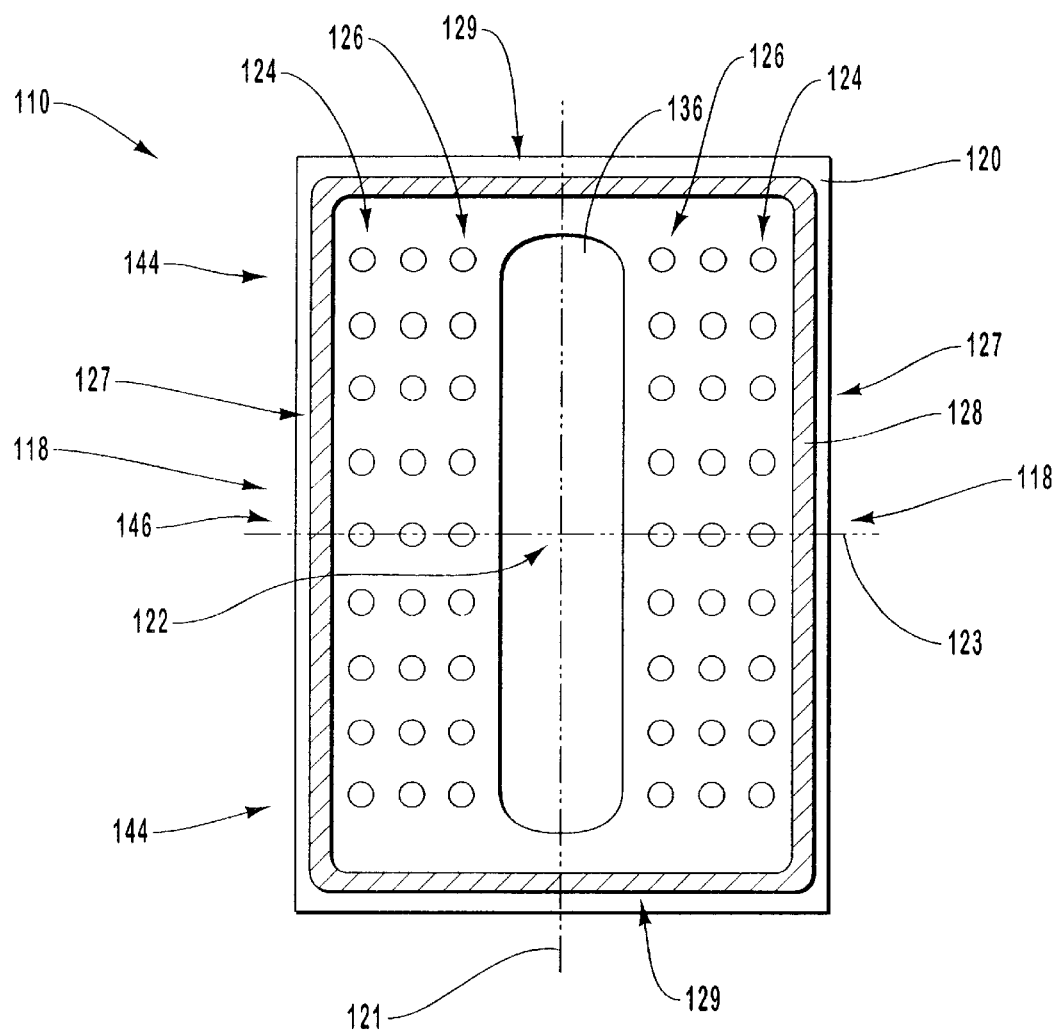
FIG. 3 is a top plan view of a portion of the inventive chip package illustrating the inventive solder ring heat sink configuration.

FIG. 3 is a plan view displaying a portion of chip package 110. By way of non-limiting example, it can be seen that PCB 120 supports two three-by-nine ball arrays 118 that are configured around slot 136. Around the perimeter of ball arrays 118, solder ring heat sink 128 is disposed. Chip package 110 is definable as bilaterally symmetrical around a vertical null line 121 and also bilaterally symmetrical around a horizontal null line 123. Geometric center 122 is indicated in plan view as the intersection of vertical null line 121 and horizontal null line 123. During operation of chip package 110, mechanical stress is generally experienced in directions radially away from geometric center 122, which stress may be directly proportional to the distance from geometric center 122 of a given structure.

The presence of solder ring heat sink 128 provides additional heat management relief for chip package 110, and, when attached to a larger structure such as a card or a mother board, mechanical expansion away from geometric center 122 is born in greatest proportion by solder ring heat sink 128 instead of various peripheral solder balls found in the two ball arrays 118.

Solder ring heat sink 128 may be considered to be a composite of two vertical edge heat sinks 127 that are located parallel to vertical null line 121, and of two horizontal edge heat sinks 129 located on opposite extremes and parallel to horizontal null line 123.

Mechanical expansion about vertical null line 121, previously born in greatest proportion at outer ball row 124 without solder ring heat sink 128 is now born primarily in the greatest proportion by vertical edge heat sinks 127 as subcomponents of solder ring heat sink 128. Mechanical expansion away from horizontal null line 123, previously born in greatest proportion at a vertical expansion distal ball row 144 without solder ring heat sink 128, is born in the present invention primarily by the two horizontal edge heat sinks 129 that are subcomponents of solder ring and heat sink 128.

Figure 4:
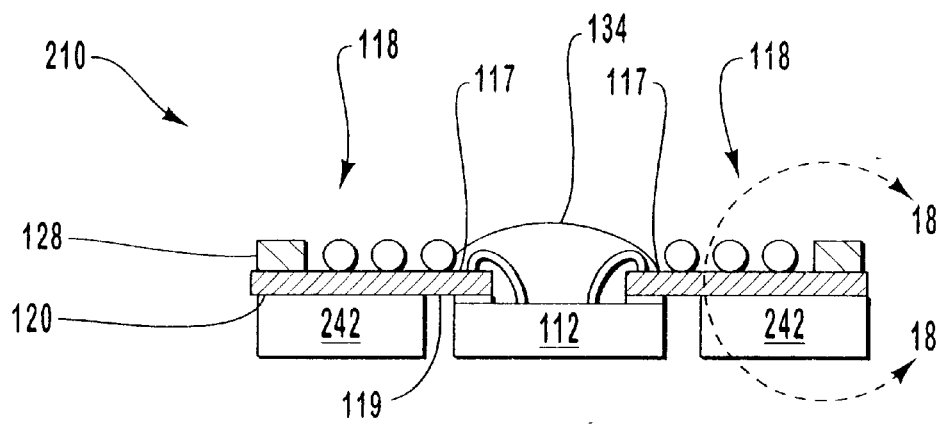
FIG. 4 is an elevational cross-section view of an inventive chip package that includes additional heat sink structure on a side of the board opposite the inventive solder dam or ring.

In an alternative embodiment of the present invention, a chip package 210 illustrated in FIG. 4, has substantially the same structure as chip package 110 illustrated in FIG. 2. Additionally, two chip-level heat sinks 242 are disposed upon PCB underside 119 along with integrated circuit chip 112. Chip-level heat sinks 242 may be configured as a ring, similar to solder ring heat sink 128, seen in FIG. 3, or as a dam, seen in FIGS. 8 and 9 which are discussed below.

Chip-level heat sinks 242 may have an elevation that is substantially the same as integrated circuit chip 112 including encapsulant material such that no additional elevational profile below PCB underside 119 is added to chip package 210. In addition to providing enhanced heat sink capability to chip package 210, the presence of chip-level heat sink 242 provides additional structural stability to PCB 120.

Figure 4A:
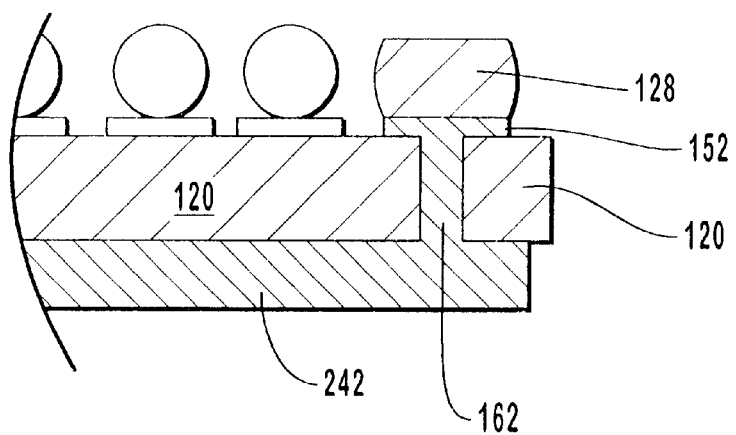
FIG. 4A is a detail section of the chip package depicted in FIG. 4, that illustrates a via.

PCB 120 may have a via 162, as seen in FIG. 4A or a plurality of vias, that connects solder ring heat sink 128 to chip-level heat sinks 242. During reflow of the two ball arrays 118 and optionally of solder ring heat sink 128, solder ring heat sink 128 and chip-level heat sinks 242 may also partially reflow, or only one of them, so as to make direct physical contact therebetween. Thereby, heat conduction therebetween when so preferred is facilitated. In the present invention, for any embodiment in this disclosure, or equivalents provide two heat sinks that are located on exactly opposite sides of a PCB, a via or a plurality of vias may be configured through the PCB to facilitate heat management.

Figure 5:
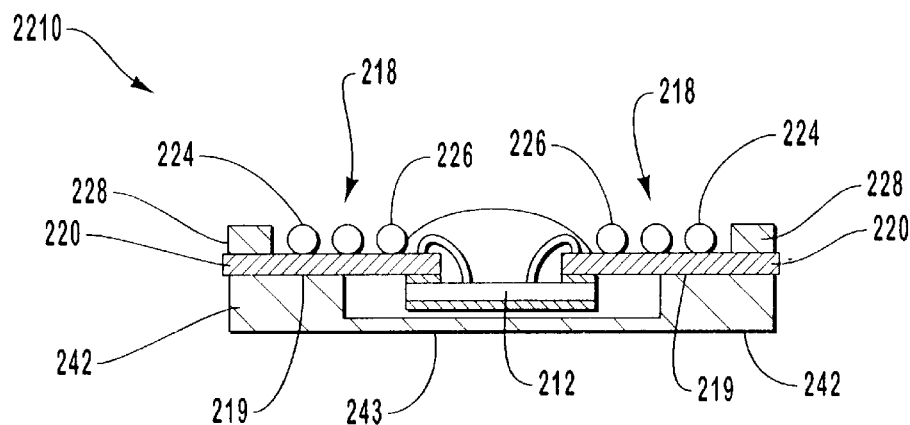
FIGS. 5 and 6 are elevational cross-section views of alternatives to the inventive chip package illustrated in FIG. 4.
Figure 6:
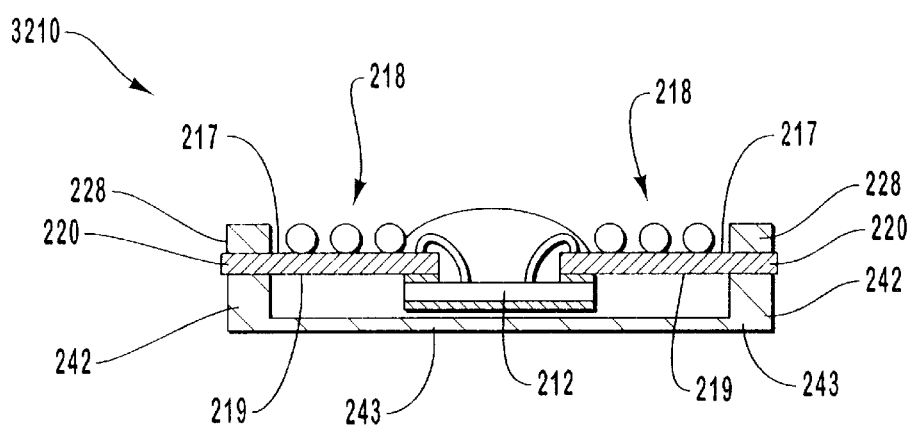

FIGS. 5 and 6 illustrate chip packages 2210 and 3120, respectively as alternative embodiments of chip package 210, illustrated in FIG. 4. In addition to solder ring heat sink 228 and chip-level heat sink 242, illustrated in FIG. 4, the depicted embodiments have been enhanced to include a die-attach portion 243 of chip-level heat sink 242. As can be seen in FIG. 5, heat flow from integrated circuit chip 212 to solder ring heat sink 228 may be accomplished by two conductive paths. The preferred conductive path of heat flow from integrated circuit chip 212 to solder ring heat sink 228 is from die-attach portion 243 of chip-level heat sink, into chip-level heat sink 242, through PCB 220 (optionally through vias as set forth above) and into solder ring heat sink 228. Additionally, heat may be dissipated from die-attach portion 243 and from chip-level heat sink 242 by radiation and convection. Die-attach portion 243 may be a composite with chip-level heat sink 242, or it may be an integral structure such as stamped metal.

Additionally, a heat transfer path is provided beginning at integrated circuit chip 212, into PCB 220, along PCB 220 in the area of ball arrays 218, and ultimately into solder ring heat sink 228. The combination of chip-level heat sink 242 and its integral or composite die-attach portion 243, represents a heat flow bypass around ball arrays 218.

In FIG. 6, the "footprint" or interface area of chip-level heat sink 242 upon PCB underside 219 is depicted as substantially matching the "footprint" or interface area of solder ring heat sink 228 upon PCB upper side 217. PCB upper side 217 is also referred to as the first side 217. PCB underside 219 is also referred to as the second side 219. The structure depicted in FIG. 6 illustrates a conductive heat flow bypass around ball arrays 218 through die-attach portion 243 and through chip-level heat sink 242 itself. This embodiment is preferred where it is desirable to limit the amount of conductive heat transfer through PCB 220 across ball arrays 218.

As can be appreciated by one of ordinary skill in the art, a balance may be struck between minimizing the footprint or interface area of chip-level heat sink 242 to avoid conductive heat transfer through PCB 220 into ball arrays 218, and providing an optional heat sink in the form of chip-level heat sink 242 that facilitates both conductive and radiative heat transfer away from integrated circuit chip 212. When aided by a blower or fan and the like, convective heat transfer away from integrated circuit chip 212 or other structures disclosed herein are also enhanced by the present invention. Interface area ratios may vary from 10:1 to 1:10 and are preferably in a range from 2:1 to 1:2. They may also be about 1:1.

In an alternative embodiment, chip-level heat sink 242 may be made of the same or similar material as solder ring heat sink 228 and die-attach portion 243. Chip-level heat sink 242 may be made of a piece that is stamped or may be formed metal, either of which chip-level heat sink 242 will adhere to during reflow thereof.

Figure 7:
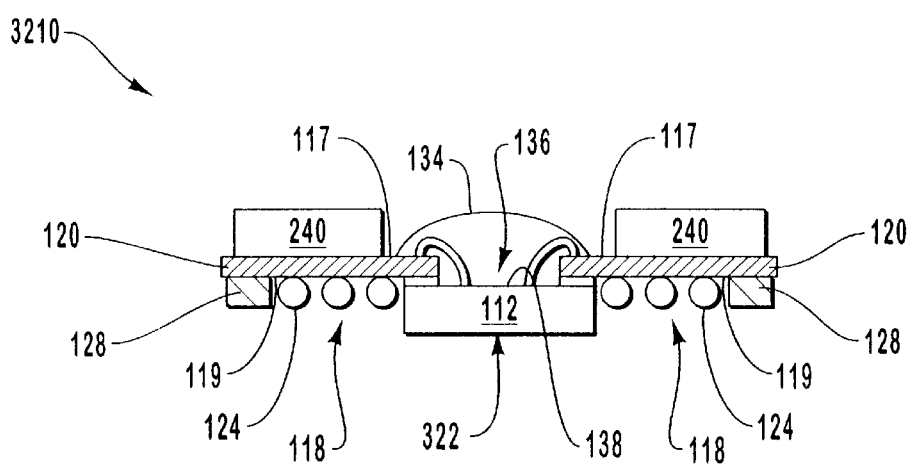
FIG. 7 is an elevational cross-section view of another embodiment of the inventive chip package.

FIG. 7 is an elevational cross-section view of a chip package 4210, having the BOC configuration of FIGS. 3 and 4, but having ball arrays 118 disposed upon PCB underside 119 or second side 119. Additionally, solder ring heat sink 128 is also disposed distal from a geometric center 322 of chip package 4210 and also distal to outer ball 124 from geometric center 322.

Chip package 4210 includes integrated circuit chip 112 having active surface 138 affixed against PCB underside 119. Ball arrays 118 and solder ring heat sink 128 are also disposed upon PCB 120 at PCB underside 119. Ball arrays 118 are located between solder ring heat sink 128 and geometric center 322.

Where integrated circuit chip 112 extends below the lower extreme of ball arrays 118, and where ball arrays 118 and solder ring heat sink 128 are attached to another structure such as a card, of a mother board, and the like, integrated circuit chip 112 may fit into a depression in the card, mother board, or the like so as to assure proper contact of ball arrays 118 and solder ring heat sink 128 thereto.

Disposed upon first side 117 is an optional structure that includes a chip-opposite heat sink 240. Chip-opposite heat sink 240 provides both thermal management qualities and structural stability to chip package 4210.

Figure 8:
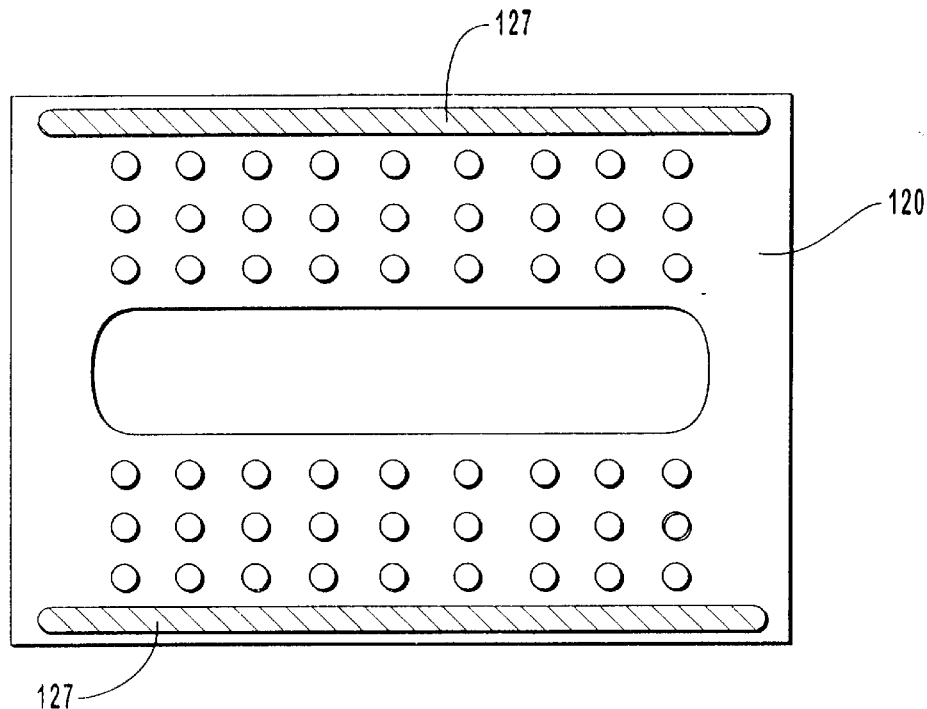
FIGS. 8 and 9 are plan views of alternative embodiments comprising variations in the inventive solder dam heat sink.
Figure 9:
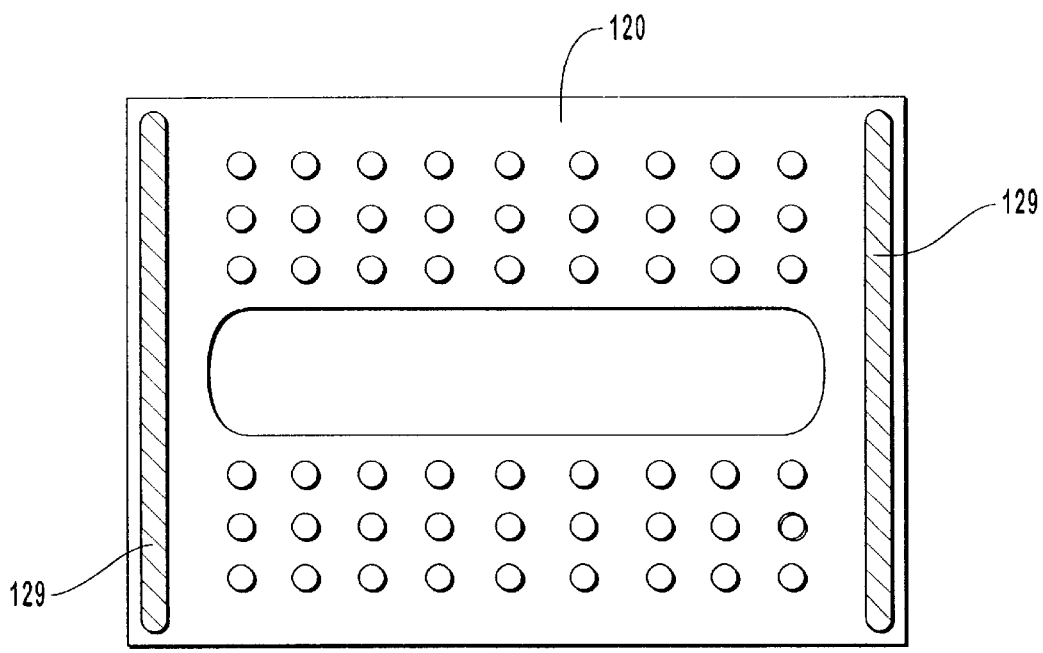

FIG. 8 and FIG. 9 illustrate alternative embodiments of the present invention, wherein two vertical edge heat sinks 127 as seen in FIG. 8, or two horizontal edge heat sinks 129 as seen in FIG. 9 may be provided according to the heat transfer needs of a specific application. Additionally, a chip-level heat sink or a chip-opposite heat sink may be configured with these chip packages for additional heat management quantities and structural advantages.

For the purpose of delineating preferred embodiments for the invention, the presence of either the two vertical edge heat sinks 127 or the two horizontal edge heat sinks 139 may be inferred as preferred alternatives in each embodiment disclosed herein where solder ring heat sink 128 is mentioned. As such, solder ring heat sink 128 may be present for only one of either the vertical edge heat sinks 127 or the horizontal edge heat sinks 129, depending upon the specific application.

Figure 10:
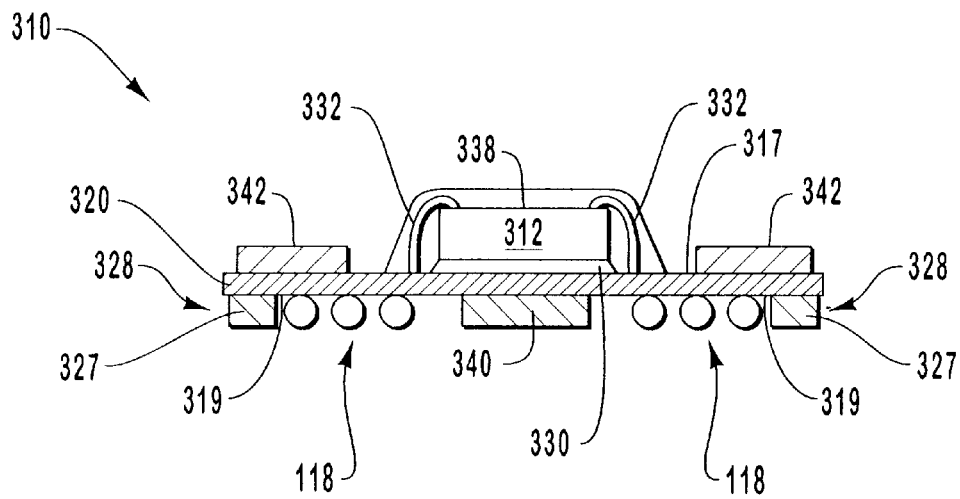
FIG. 10 is an elevational cross-section view of another embodiment of the inventive chip package with an optional second heat sink structure.

The present invention is also advantageously used in chip on board (COB) technology. FIG. 10 is an illustration of a COB chip package 310. It can be seen that a PCB 320 has an integrated circuit chip 312 disposed upon a PCB upper side 317 and secured thereto at its inactive surface with an adhesive 330 such as a die-attach epoxy or the like. PCB upper side 317 is also referred to as the first side 317. In COB technology, an active surface 338 of integrated circuit chip 312 is not disposed against PCB 320. Upon PCB underside 319, two ball arrays 118 are disposed along with a solder ring heat sink 328. Where ball arrays 118 allow, a chip-opposite heat sink 340 may also be provided for additional heat management qualities and structural advantages.

An alternative embodiment of chip package 310 is seen in FIG. 10. FIG. 10 may be further understood by viewing it as a cross-section taken along the line X—X from either FIG. 11 or FIG. 12. In FIG. 10, chip package 310 includes, in addition to optional chip-opposite heat sink 340, a chip-level heat sink 342 that may be disposed upon PCB upper side 317. For chip package 310, chip-opposite heat sink 340 and solder ring heat sink 328 may be made of a single, integral or composite structure in order to facilitate heat by conduction and radiation away from integrated circuit chip 312. Added to the integral or composite structure may be chip-level heat sink 342. Optionally, the integral or composite structure may include only solder ring heat sink 328 and chip-level heat sink 342, with or without the presence of chip-opposite heat sink 340. The integral or composite structure may be accomplished by reflow through vias in PCB 320.

Figure 11:
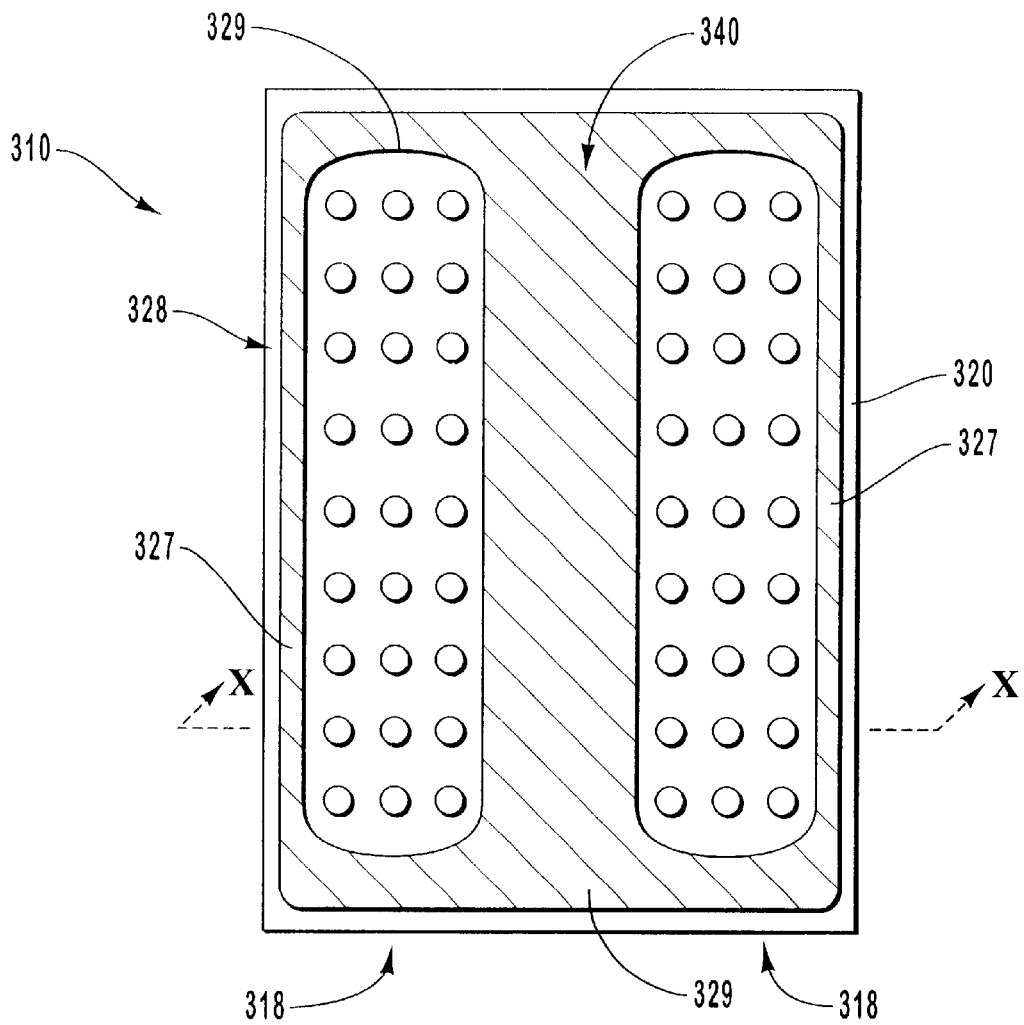
FIG. 11 is a bottom plan view of a portion of the inventive chip on board package with a second heat sink structure.

FIG. 11 is a bottom plan view depicting one embodiment of a portion of chip package 310 depicted in FIG. 10 where solder ring heat sink 328 and chip-opposite heat sink 340 are an integral or composite unit. In FIG. 11, it can be seen that solder ring heat sink 328 includes a central section comprising chip-opposite heat sink 340, and perimeter regions including two vertical edge heat sinks 327 and two horizontal edge heat sinks 329. Additionally, through at least one via (not pictured) in PCB 320, chip-level heat sink 342 and solder ring heat sink 328 may be reflowed to become an integral unit or a composite unit that is physically connected.

Figure 12:
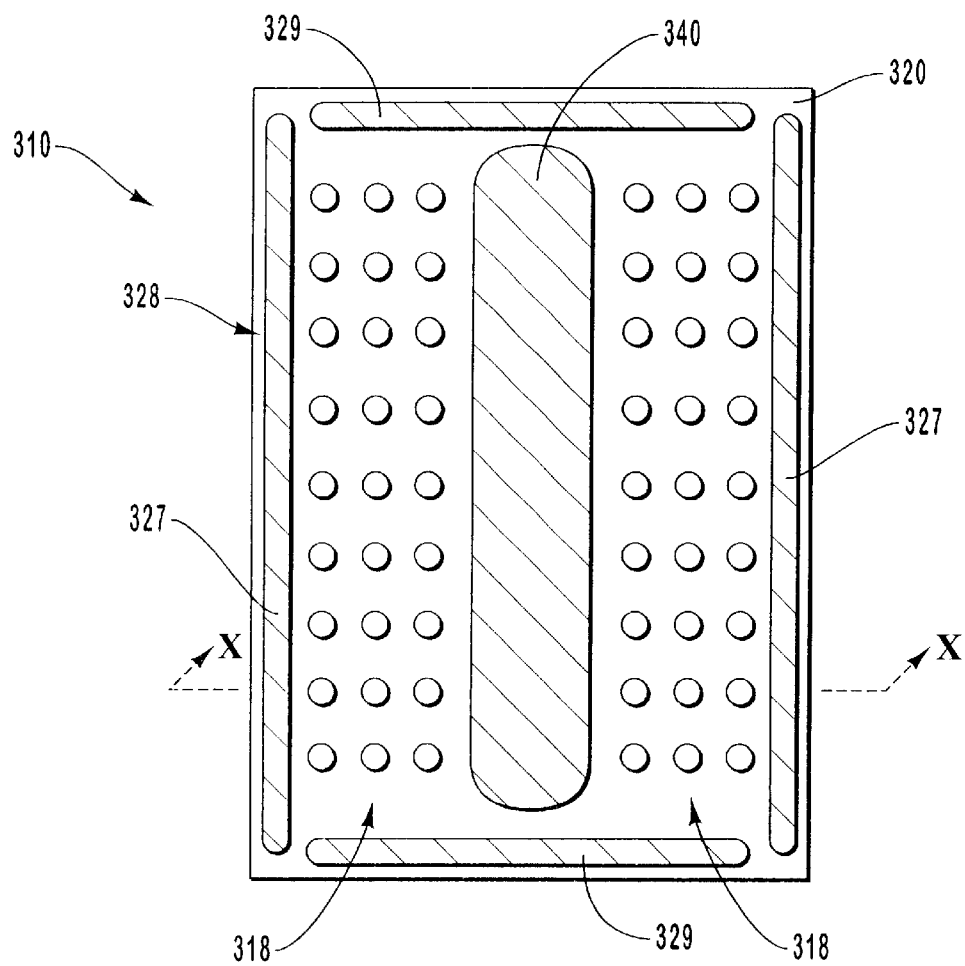
FIG. 12 is a bottom plan view of a portion of the inventive chip on board package with the second heat sink structure and configured with other heat sinks as discrete heat sinks.

FIG. 12 is another bottom plan view depicting another embodiment of a portion of chip package 310 depicted in FIG. 10. Chip package 310 includes solder ring heat sink 328 and chip-opposite heat sink 340. In contrast to an integral total heat sink depicted in FIG. 11, solder heat sink 328 and chip-opposite heat sink 340 are discrete heat sinks. In FIG. 12, it can be seen that solder ring heat sink 328 includes a central section comprising chip-opposite heat sink 340, and perimeter regions including two vertical edge heat sinks 327 and two horizontal edge heat sinks 329. Additionally, through at least one via (not pictured) in PCB 320, chip-level heat sink 342 and solder ring heat sink 328 as its discrete component, may be reflowed to make physical connection thereto.

Figure 13:
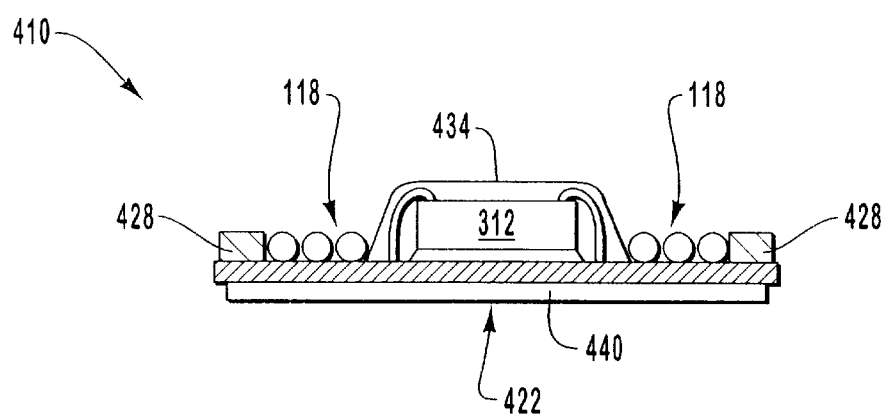
FIG. 13 is an elevational cross-section view of the inventive chip on board package with an optional second heat sink structure.

FIG. 13 is another embodiment of the present invention, wherein it can be seen that a COB chip package 410 includes a solder ring heat sink 428 that is distal to two ball arrays 118 in relation to a geometric center 422. A chip-opposite heat sink 440 may also be provided in this embodiment for additional heat management and for structural qualities. Where ball arrays 118 are to be mounted against a structure such as to a card, to a mother board, or the like, and where the profile of the encapsulant 434 is higher than ball arrays 118, a depression in the structure such as the card, mother board, or the like may be provided.

Figure 14:
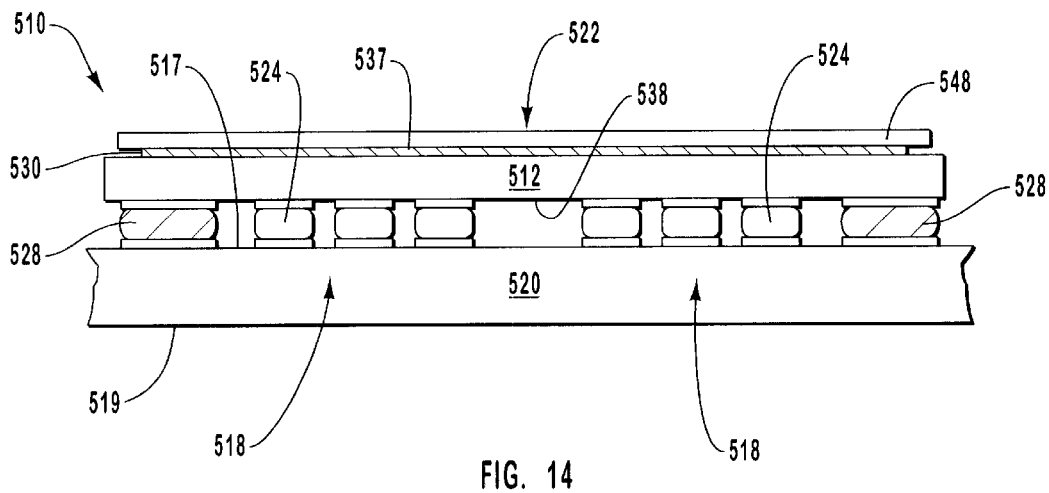
FIG. 14 is an elevational cross-section view of the inventive flip chip on board technology with the inventive solder ring or dam heat sink.

FIG. 14 is another embodiment of the present invention, wherein a chip package 510 comprises an integrated circuit flip chip 512 that is mounted with its active surface 538 downwardly facing and its ball arrays 518 making direct contact with a PCB 520. As can be seen, the outer ball 524 is between a solder ring heat sink 528 and a geometric center 522. As mechanical expansion is experienced around geometric center 522, and as flip chip 512 expands and contracts, solder ring heat sink 528 not only transfers excess heat out of flip chip 512, but also bears the greatest amount of mechanical expansion stress that is experienced between flip chip 512 and PCB 520, transferred through both ball arrays 518 and solder ring heat sink 528. Optionally, a die-attach heat sink 548 may be adhered to the inactive surface 537 of integrated circuit chip 512. Optionally, chip package 510 may be mounted on a structure 550, which can be a motherboard or expansion card. Thus, chip package 510 comprises integrated circuit chip 512 having active surface 538. Integrated circuit chip 512 is mounted upon printed circuit board 520. Printed circuit board 520 has a first side 517 and a second side 519 that is parallel to first side 517. Integrated circuit chip 512 has a geometric center 522 and is disposed upon ball array 518. A heat sink 528, which may be a ring or a dam, is disposed upon printed circuit board 520. Heat sink 528 is in thermal communication with integrated circuit chip 512 and, if a ring, encompasses ball array 518, and if a dam, borders ball array 518 distal to geometric center 522.

Figure 15:
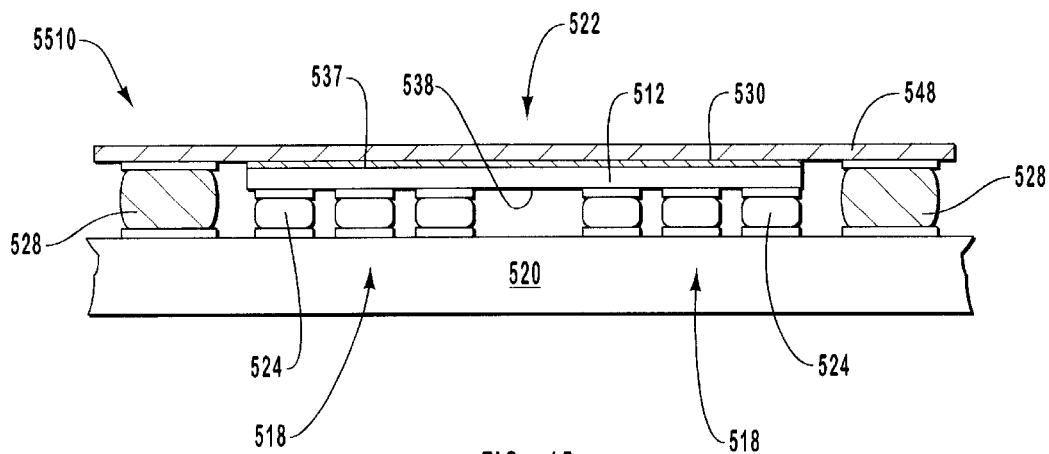
FIG. 15 is an elevational cross-section view of the inventive flip chip on board technology with the inventive solder ring or dam connected to a die-attach structure.

In an alternative embodiment of the present invention, a chip package 5510 shown in FIG. 15 illustrates die-attach heat sink 548 affixed to inactive surface 537 of flip chip 512 by the use of an adhesive 530 such as a die-attach epoxy or the like. Die-attach heat sink 548 absorbs heat from flip chip 512 and may conduct heat away from more heat-generating areas of flip chip 512. As heat is generated in flip chip 512, die-attach heat sink 548 absorbs heat therefrom and is allowed to transmit heat by conduction through solder ring heat sink 528 and into PCB 520. Accordingly, outer ball 524 experiences less mechanical expansion shear because of the presence of solder ring heat sink 528. Additionally, solder ring heat sink 528 and die-attach heat sink 548 may be made of a single unit such as a stamped, forged, or molded metal article. Alternatively, the combination of die-attach heat sink 548 and solder ring heat sink 528 may be made of an integral unit similar to the combination of chip-level heat sink 242 and die-attach portion 243, similar to the embodiments illustrated in FIGS. 5 and 6. Optionally, chip package 5510 may be mounted on a structure 550, which can be a motherboard or expansion card.

Figure 16:
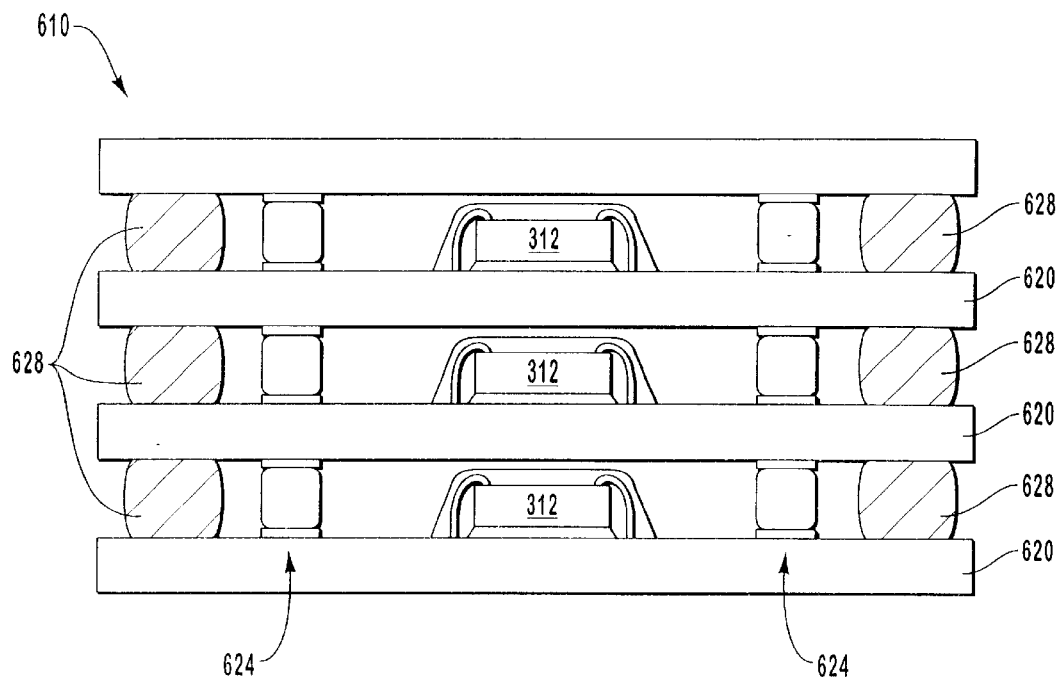
FIG. 16 is an elevational cross-section view of the inventive chip on board package in a stacked configuration that includes the inventive solder ring or dam heat sink.

FIG. 16 is another embodiment of the present invention, wherein a stacked chip package 610 is illustrated. Stacked chip package 610 provides the advantage of additional structural strength and additional heat management. Where a single occurrence of an integrated circuit chip 312 may be more active than another in stacked chip package 610, the structure supporting less active occurrences of integrated circuit chip may act as a heat sink for the more active chip. A ball array 624 separates adjacent PCBs. The structure also provides additional heat sink qualities by virtue of its composite structure. As set forth above, PCB 620 may have a via (not pictured) that will accept reflow of solder ring heat sink 628 therethrough. As such, direct metallic contact between any two occurrences of stacked solder ring heat sink 628 provides an integral or composite unit that will facilitate both structural advantages and heat management qualities.

In each embodiment set forth above, an underfill material may be supplied to give additional structural advantages to any chip package. Typically, the underfill material is a thermoplastic or a natural or synthetic resin that may be injected into the area between chip and board, including the geometric center, and the ball array. The underfill material is preferably selected for its heat transfer abilities that facilitate heat transfer, for its coefficient of mechanical expansion to be close to that of structures it contacts, or both.

Referring again to FIG. 3 by way of non-limiting example, the formation of ball arrays 118 and of solder ring heat sink 128 may be accomplished by various methods. For example, solder ring heat sink 128 may be formed by stamping, molding, and casting and set onto PCB 120 by pick-and-place technology. The placement of solder ring heat sink 128 may be accomplished after the establishment of ball arrays 118. Ball arrays 118 may be also established by pick-and-place technology, or they may be silk screened and allowed to reflow to form solder balls. Alternatively, solder ring heat sink 128 and ball arrays 118 may be formed simultaneously by a silk screening process that uses a single screen with both ball arrays 118 and solder ring heat sink 128 impressed therein. Multiple silk screenings may be made to build up solder ring heat sink 128 and/or ball arrays 118.

Ball arrays 118 and solder ring heat sink 128 may be made of the same material, preferably a tin-lead solder. Where it is advantageous, solder ring heat sink 128 may be made of a material different from ball arrays 118. For example, solder ring heat sink 128 may be made of an electrically conductive material that provides both higher heat transfer and greater adhesion (e.g., wetting during reflow) to PCB 120 than ball arrays 118. Without, or with either or both of these advantages, ball arrays 118 are still protected from at least some of the mechanical stresses experienced in the prior art by both the heat management qualities and the structural advantages of solder ring heat sink 128.

In addition to pick-and-place technology or silk screen technology, ball arrays 118 and/or solder ring heat sink 128 may be disposed upon PCB 120 by the use of writing technology. For example, a metallic paste dropper/writer may be used to delineate solder ring heat sink 128 after the establishment of ball arrays 118. Chip package 110 can then be thermally processed to volatilize materials in solder ring heat sink 128.

Figure 17:
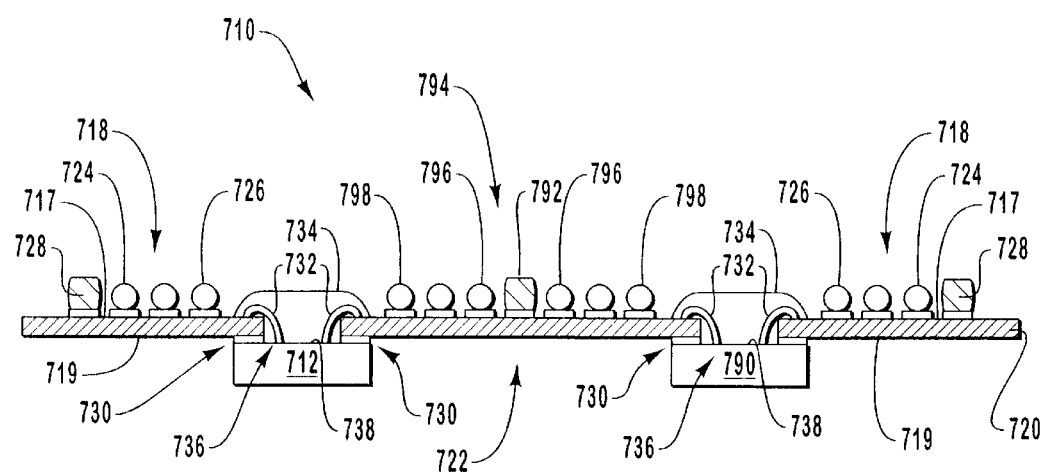
FIG. 17 is an elevational cross-section view of another embodiment of the inventive chip package.

FIG. 17 is an elevational cross-section view of a chip package 710 according to the present invention. Chip package 710 includes an integrated circuit chip 712 such as a central processor unit (CPU) chip, and a second integrated circuit chip 790 such as a dynamic random access memory (DRAM) chip. FIG. 17 illustrates that integrated circuit chips 712 and 790 are attached to a PCB 720 by use of an adhesive 730 such as a die-attach epoxy or equivalent. Chip package 710 has a geometric center 722. Bond wires 732 make electronic connections between integrated circuit chips 712, 790 and PCB 720 through slots 736 in PCB 720. Within PCB 720, traces (not pictured) make electrical contact between integrated circuit chips 712, 790 and ball arrays 718.

FIG. 17 also illustrates an optional central heat sink 792. Optionally, central heat sink 792 may be removed to allow for a shorter breadth of PCB 720, or for a larger central ball array 794.

Ball arrays 718, in proximal relation to solder ring heat sink 728 and when viewed in cross section, may include an outer ball 724, an inner ball 726, and optionally other balls located therebetween. Ball arrays 718 may also include a single row on each side of slot 736. Central ball array 794 may include an outer ball 796, an inner ball 798, and optionally other balls located therebetween. Ball arrays 718, 794 are located upon a PCB upper side 717. PCB upper side 717 is also referred to as the first side 717.

Although the configuration of chip package 710, as seen in FIG. 17, is BOC, a COB configuration is also possible according to the present invention. As a BOC, integrated circuit chips 712, 790 are attached to the underside 719 of PCB 720. Underside 719 of PCB 720 is also referred to as the second side 719. Active surfaces 738 of integrated circuit chips 712, 790 are affixed against underside 719.

An encapsulant 734 is disposed partially upon PCB 720 and partially upon active surfaces 738 of integrated circuit chips 712, 790. Thereby, encapsulant 734 protects bond wires 732 during assembly and during field use. Geometric center 722 of chip package 710 is represented in FIG. 17 as being substantially the bilaterally symmetrical center of chip package 710 when viewed in elevational cross-section view.

Distal to outer ball 724 are heat sinks 728 that may be a solder dam or solder ring, also disposed upon PCB upper side 717. Solder ring heat sink 728 provides additional strength to chip package 710 if it is attached to a larger structure such as to a card or to a mother board. As integrated circuit chip 712 generates heat, solder ring heat sink 728 bears most of the mechanical expansion stress because during mechanical expansion, solder ring heat sink 728 is disposed farthest from geometric center 722.

It becomes clear that the stacked relationship depicted in FIG. 16 may also be applied to the multiple BOC embodiment set forth in FIG. 17. By the stacking multiple two-chip BOC packages, additional mechanical strength and compact packaging may be realized. This embodiment therefore includes a plurality of PCBs disposed in serial stacked relation to each other, wherein at least two IC ships are disposed upon each PCB. In this embodiment, each PCB has a first ball array disposed upon one side of each PCB. Further, each PCB has a central ball array disposed upon the same side of each PCB and disposed symmetrically to the geometric center. Finally, a corresponding plurality of first heat sinks is disposed upon and in thermal communication with the same side of each PCB as each first ball array, each first ball array being located between the first heat sink and the geometric center.

Figure 18:
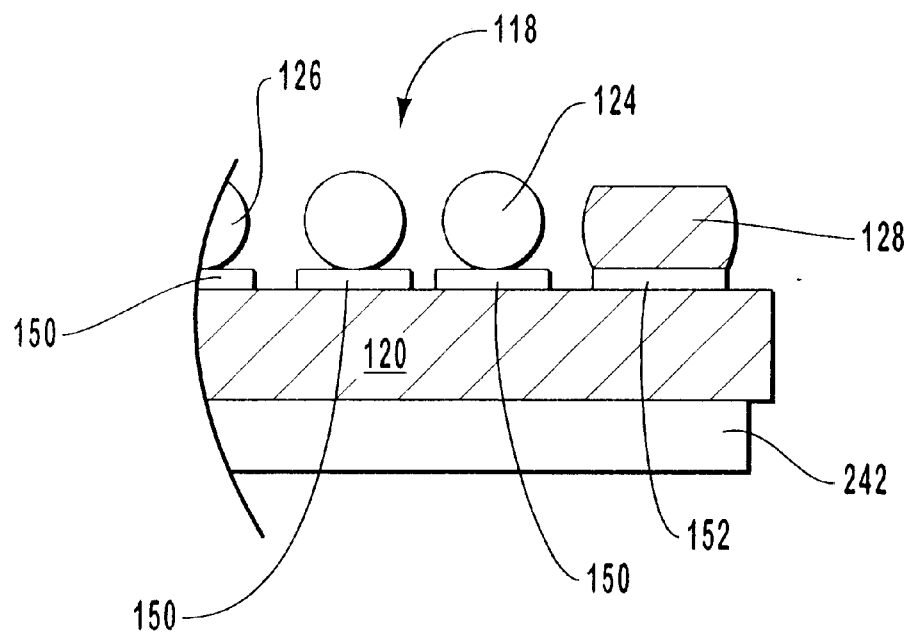
FIG. 18 is a detail section taken along the line 18—18 seen in FIG. 4.

FIG. 18 is a detail section taken from FIG. 4 along the line 18—18. In FIG. 18, it can be seen that the individual solder balls of ball arrays 118 including outer ball 124 and inner ball 126 etc., are each disposed upon a ball contact pad 150. Additionally, solder ring heat sink 128 is disposed upon a heat sink contact pad 152. Ball contact pad 150 and solder ring heat sink contact pad 152 may be made of the same material. For example, ball contact pad 150 and solder ring heat sink contact pad 152 may be made of copper. Other compositions of contact pads may be composites such as a copper, nickel stack.

Figure 19:
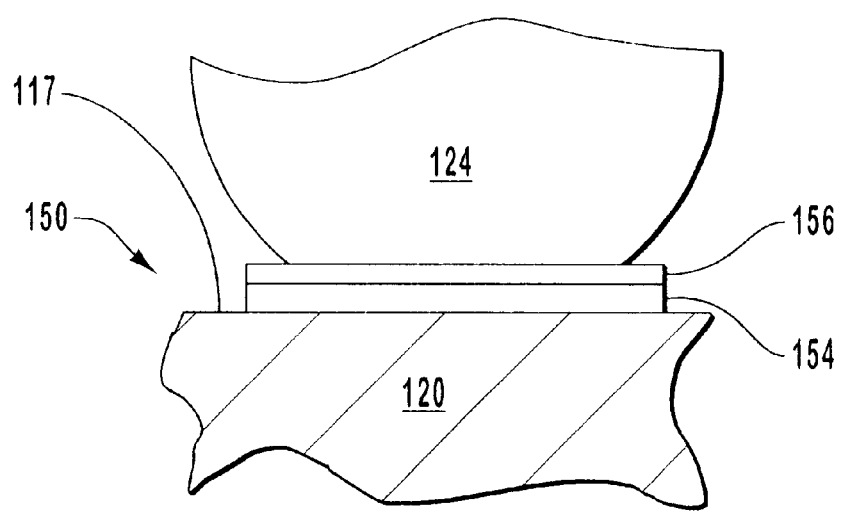
FIG. 19 is a detail of a solder ball or solder ring or dam heat sink structure and its connection through a contact pad to a printed circuit board.

FIG. 19 is an illustration of one example of a composite contact pad. For example, a copper pad 154 may be disposed upon PCB upper side 117, and a nickel pad 156 may be disposed upon upper copper pad 154. This configuration, as with others, may be selected so as to facilitate the wetting of solder ball 124 onto ball contact pad 150. The same selection of the preferred composite heat sink contact pad may also be done in order to facilitate wetting of the corresponding solder ring heat sink.

Figure 20:
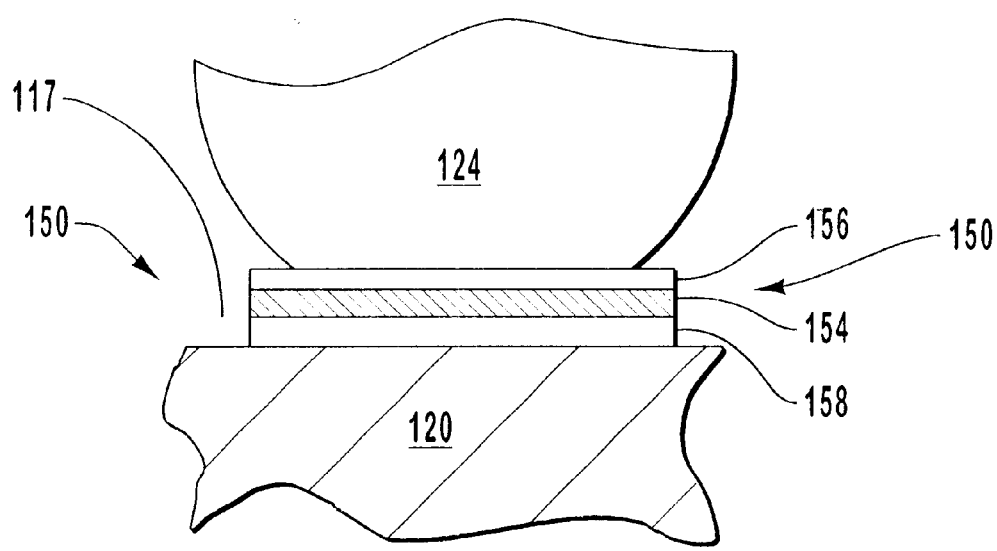
FIG. 20 is an alternative embodiment of the structure depicted in FIG. 19.

Other configurations for either solder balls or for the solder ring heat sink are illustrated in FIG. 20. One configuration includes a copper contact pad 158 disposed upon PCB upper side 117, followed by a nickel contact pad 154 and a gold contact pad 156 disposed thereupon.

Figure 21:
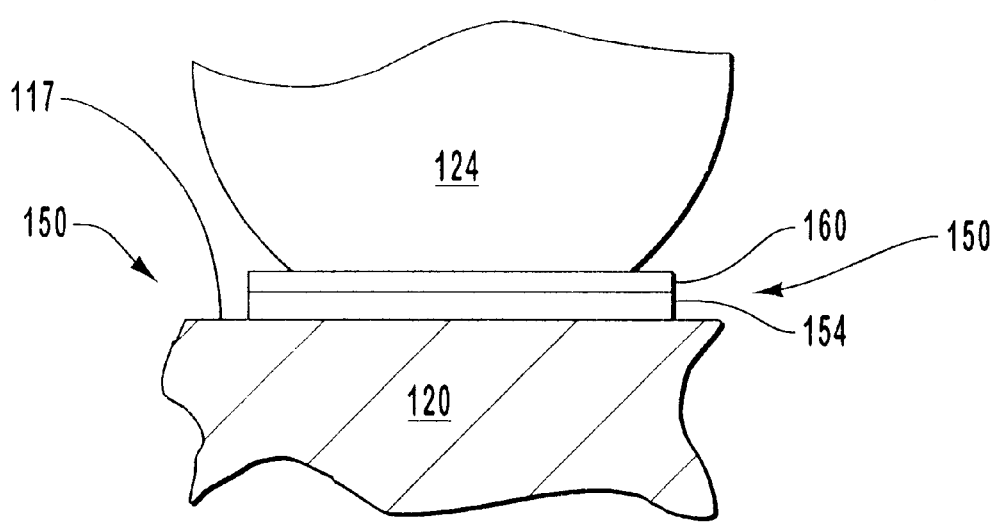
FIG. 21 is an alternative embodiment of the structure depicted in FIG. 19.

FIG. 21 is another embodiment of the present invention, wherein solder ball 124 or a solder ring heat sink structure is disposed upon a palladium contact pad 160 that is affixed to a copper contact pad 154.

Any combination of ball contact pad 150 and heat sink contact pad 152 may be made according to specific advantages of a given application of the present invention. For example, where solder ring heat sink 128 is of sufficient size so as to effectively manage the generated heat load of chip package 110 during ordinary field use, solder ring heat sink 128 may be affixed to PCB 120 with a pad that has the same or even less adhesion or wetting than the balls of ball arrays 118. Alternatively, the adhesion of solder ring heat sink 128 to a given pad or composite pad structure may be preferably greater than the balls of ball arrays 18 so as to give greater structural advantages.

Distinct advantages exist in using preferred heat sink materials in the present invention. The heat sink structure itself is preferably a solder such as SnPb. Another preferred embodiment is SnIn. Another preferred embodiment includes SnPbAg. Another preferred embodiment is SnInAg. Another preferred embodiment includes SnInPb. Finally, a preferred embodiment includes SnInPbAg. Both the heat sink and the ball array may be made of solder. Preferably both the heat sink and the ball array are made of the same solder.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. An integrated circuit chip package comprising:
   an integrated circuit (IC) chip having an active surface and an opposite inactive surface, the active surface having a plurality of electrical contacts thereon;
   a first heat sink upon the inactive surface of the IC chip;
   a printed circuit board (PCB) having a plurality of electrical contacts thereon, each being in contact with one said electrical contact of the IC chip, the PCB having a first side; and
   a second heat sink having first and second opposite portions and being situated in between the first side of the PCB and the active surface of the IC chip, wherein the electrical contacts on the PCB are situated between the first and second opposite portions of the second heat sink.

2. The IC chip package as defined in claim 1, wherein:
   the first heat sink is attached with an adhesive to the inactive surface of the IC chip; and
   the second heat sink surrounds the ball array and is attached to both the first side of the PCB and the active surface of the IC chip.

3. The IC chip package as defined in claim 1, wherein the IC chip has a geometric center disposed equidistantly between the first and second opposite portions of the second heat sink.

4. The IC chip package as defined in claim 1, wherein the IC chip is a flip chip.

5. The IC chip package as defined in claim 1, wherein the plurality of electrical contacts on the PCB is a ball array.

6. The IC chip package as defined in claim 1, wherein the first and second heat sinks are composed of a tin alloy.

7. The IC chip package as defined in claim 6, wherein the alloy includes tin and at least one element selected from In, Ag, Pb, and combinations thereof.

8. The IC chip package as defined in claim 6, wherein the first and second heat sinks and the plurality of electrical contacts on the PCB are composed of a tin alloy.

9. The IC chip package as defined in claim 8, wherein the alloy includes tin and at least one element selected from In, Ag, Pb, and combinations thereof.

10. The IC chip package as defined claim 1, wherein the first and second heat sinks comprise a material selected from the group consisting of SnPb, SnIn, SnPbAg, SnInAg, SnInPb, and SnInPbAg.

11. An integrated circuit (IC) chip package comprising:
- an IC chip having an active surface and an opposite inactive surface, the active surface having a plurality of electrical contacts there on;
- a first heat sink attached to the inactive surface of the IC chip;
- a second heat sink attached to the active surface of the IC chip; and
- a printed circuit board (PCB) attached to the second heat sink, said PCB having a plurality of electrical contacts thereon, wherein:
  - the second heat sink surrounds the plurality of electrical contacts on the PCB;
  - each said electrical contact on the IC chip contacts a respective one of said electrical c contacts on the PCB;
  - the plurality of electrical contacts on the PCB have opposite sides each of which is adjacent to the second heat sink; and
  - the plurality of electrical contacts on the PCB is situated between the PCB and the active surf ace of the IC chip.

12. The IC chip package as defined in claim 11, wherein the first and second heat sinks comprise at least one tin alloy including tin and at least one element selected from In, Ag, Pb, and combinations thereof.

13. The IC chip package as defined in claim 11, wherein the first and second heat sinks comprise a material selected from the group consisting of SnPb, SnIn, SnPbAg, SnInAg, SnInPb, and SnInPbAg.

* * * * *

UNITED STATES PATENT AND TRADEMARK OFFICE
CERTIFICATE OF CORRECTION

PATENT NO. : 6,426,875 B1
DATED : July 30, 2002
INVENTOR(S) : Salman Akram and Larry Kinsman It is certified that error appears in the above-identified patent and that said Letters Patent is hereby corrected as shown below:

Column 2,
Line 22, change "bum" to -- burn --

Column 14,
Line 8, change "surf ace" to -- surface --

Signed and Sealed this

Twenty-fifth Day of February, 2003

JAMES E. ROGAN
*Director of the United States Patent and Trademark Office*